(12) United States Patent
Song

(10) Patent No.: US 9,443,570 B1
(45) Date of Patent: Sep. 13, 2016

(54) MEMORY APPARATUS WITH TRAINING FUNCTION AND MEMORY SYSTEM USING THE SAME

(71) Applicant: SK hynix Inc., Icheon-si Gyeonggi-do (KR)

(72) Inventor: Keun Soo Song, Icheon-si Gyeonggi-do (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/950,372

(22) Filed: Nov. 24, 2015

(30) Foreign Application Priority Data

Jul. 13, 2015 (KR) ........................ 10-2015-0099322

(51) Int. Cl.
*G11C 7/00* (2006.01)
*G11C 7/22* (2006.01)
*G11C 7/10* (2006.01)

(52) U.S. Cl.
CPC .............. *G11C 7/222* (2013.01); *G11C 7/106* (2013.01); *G11C 7/22* (2013.01)

(58) Field of Classification Search
CPC .......... G11C 7/222; G11C 7/22; G11C 7/106

USPC ..................... 365/189.05, 191, 193, 194, 198
See application file for complete search history.

(56) References Cited

U.S. PATENT DOCUMENTS

| 7,079,441 B1* | 7/2006 | Partsch et al. | ...... | G11C 11/4072 365/226 |
| 8,135,104 B2 | 3/2012 | Kim et al. | | |
| 2006/0044891 A1* | 3/2006 | Lin et al. | ............. | G11C 7/1006 365/193 |
| 2014/0098618 A1* | 4/2014 | Kishimoto et al. | .. | G11C 7/1051 365/189.05 |

* cited by examiner

*Primary Examiner* — Tan T. Nguyen
(74) *Attorney, Agent, or Firm* — William Park & Associates Ltd.

(57) ABSTRACT

A memory apparatus includes a data receiver, a data delay unit, a strobe output unit, and a data latch unit. The data receiver may receive a plurality of symbols and generate a plurality of data and a data strobe signal. In response to a command and address signals, the data delay unit may variably delay the plurality of data and generate a plurality of delayed data. The strobe output unit may generate an internal strobe signal by delaying the data strobe signal by a predetermined delay time. The data latch unit may generate internal data from the plurality of delayed data in synchronization with the internal strobe signal.

20 Claims, 4 Drawing Sheets

MEMORY APPARATUS WITH TRAINING FUNCTION AND MEMORY SYSTEM USING THE SAME

CROSS-REFERENCES TO RELATED APPLICATION

The present application claims priority under 35 U.S.C. §119(a) to Korean application number 10-2015-0099322 filed on Jul. 13, 2015, in the Korean Intellectual Property Office, which is incorporated herein by reference in its entirety.

BACKGROUND

1. Technical Field

Various embodiments generally relate to a semiconductor apparatus, and more particularly to a memory apparatus that has a training function and a memory system using the same.

2. Related Art

A synchronous memory apparatus has an interface that is synchronized with a system bus. To put it another way, when an external device transmits a data signal to the synchronous memory apparatus, or when the synchronous memory apparatus transmits a data signal to an external device, the transmission of the data signal is synchronized with a clock. For example, the transmission of the data signal may be synchronized with a strobe signal which has the same cycle as a clock. During read and write operations of the memory apparatus, data input/output may be synchronized with the strobe signal. When the memory apparatus performs write and read operations at high speeds, it is important to control timings with respect to a clock, a strobe signal, and a data signal. As the write and read operation speed of a memory apparatus increases, however, timing skew may occur.

In order to cope with this problem, a memory apparatus may perform operations such as write training and write leveling. There are various ways to realize the write training and the write leveling. For example, the write training may be an operation that delays a strobe signal to secure a data latch margin, and the write leveling may be an operation that controls the skew between the clock and the strobe signal.

SUMMARY

In an embodiment, a memory apparatus may include: a data receiver configured to receive a plurality of symbols, and generate a plurality of data and a data strobe signal; a data delay unit configured to variably delay the plurality of data in response to a command and address signals, and generate a plurality of delayed data; a strobe output unit configured to generate an internal strobe signal based on the data strobe signal; and a data latch unit configured to generate the plurality of delayed data as internal data in synchronization with the internal strobe signal.

In an embodiment, a memory system may include: a memory controller; and a memory apparatus configured to communicate with the memory controller, the memory apparatus including: a data receiver configured to receive a plurality of symbols from the memory controller, and generate a plurality of data and a data strobe signal; a data delay unit configured to receive a command and address signals from the memory controller, variably delay the plurality of data, and generate a plurality of delayed data; and a data latch unit configured to generate internal data from the plurality of delayed data, based on the data strobe signal, wherein the memory controller receives the internal data from the memory apparatus and generates the command signal.

DETAILED DESCRIPTION

Hereinafter, a memory apparatus that has a training function and a memory system using the same will be described below with reference to the accompanying drawings through various examples of embodiments.

Figure 1:
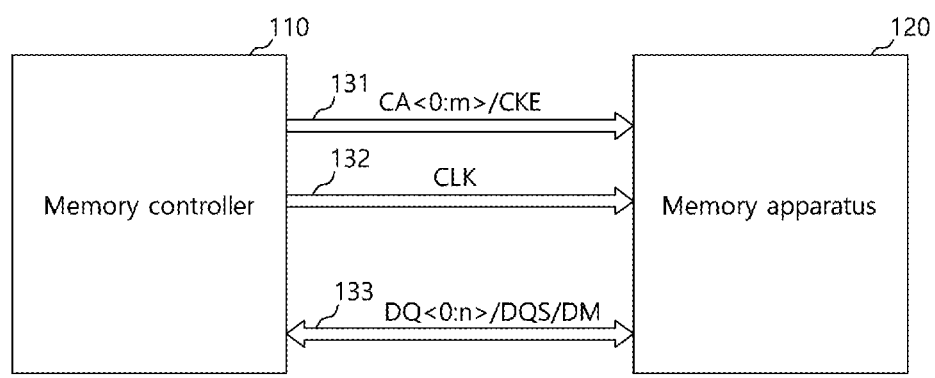
FIG. 1 is a diagram illustrating an example of a memory system in accordance with an embodiment.

Referring to FIG. 1, a memory system 1 in accordance with an embodiment may include a memory controller 110 and a memory apparatus 120. The memory controller 110 and the memory apparatus 120 may communicate with each other through a plurality of buses. In a case of master/slave configuration, the memory controller 110 may be a master device, and the memory apparatus 120 may be a slave device. The memory controller 110 may contain the logic necessary to read and write to the memory apparatus 120 and provide various control signals for controlling the memory apparatus 120. In an embodiment, when the memory controller 110 communicates with the memory apparatus 120, a balanced code signal transmission scheme may be used. In an embodiment, the memory controller 110 and the memory apparatus 120 may use a serial transmission of multi-level symbols. The multi-level symbols may be signals that are generated by encoding binary data signals and control signals so that encoded signals have a plurality of levels, states, or phases.

The memory controller 110 and the memory apparatus 120 may be coupled to one another through a plurality of buses, which may include first to third buses 131 to 133. In an embodiment, the first bus 131 may be a command bus. In another embodiment, the first bus 131 may be a signal transmission line group for transmitting a command and address signals CA<0:m> that transmits multi-level symbols in which the command and address signals CA<0:m> are encoded. In an embodiment, the second bus 132 may be a clock bus. In another embodiment, the second bus 132 may be a signal transmission line group that transmits a clock CLK and a clock enable signal CKE. In an embodiment, the third bus 133 may be a data bus. In another embodiment, the third bus 133 may be a signal transmission line group that transmits multi-level symbols in which a plurality of data DQ<0:n> are encoded. The plurality of symbols transmitted through the third bus may include not only information on the data DQ<0:n> but also information on one or both of a data strobe signal DQS and a data masking signal DM. In an embodiment, each symbol transmitted through the third bus may be a signal that is generated by encoding the data DQ<0:n>, the data strobe signal, DQS and the data masking signal DM.

In an embodiment, the memory controller 110 and the memory apparatus 120 may perform write and read operations using the plurality of symbols. In the write and read operations, the memory controller 110 may provide, to the memory apparatus 120, the plurality of symbols which have the information of the command and address signals CA<0:m> through the first bus 131, and the clock CLK through the second bus 132. In the write operation, the memory controller 110 may provide the symbols having the information on the data DQ<0:n> and the data strobe signal DQS to the memory apparatus 120 through the third bus 133. In addition, the symbols may include the information on the data masking signal DM In the read operation, the memory apparatus 120 may provide the symbols having the information on the data DQ<0:n> and the data strobe signal DQS to the memory controller 110 through the third bus 133.

Each of the memory controller 110 and the memory apparatus 120 may include a data transmitter (not shown), which generates symbols to be transmitted through the third bus 133, and a data receiver (not shown in FIG. 1), which recovers the symbols into original data and data strobe signal. The data transmitter may include an encoding logic (not shown), which converts data signals and data strobe signals into a plurality of symbols, and a serialization unit (not shown), which serially transmits the converted symbols. The data receiver may include a parallelization unit (not shown), which aligns the serially-transmitted symbols and a decoding logic (not shown), which restores a plurality of symbols into the data and the data strobe signal.

Figure 2:
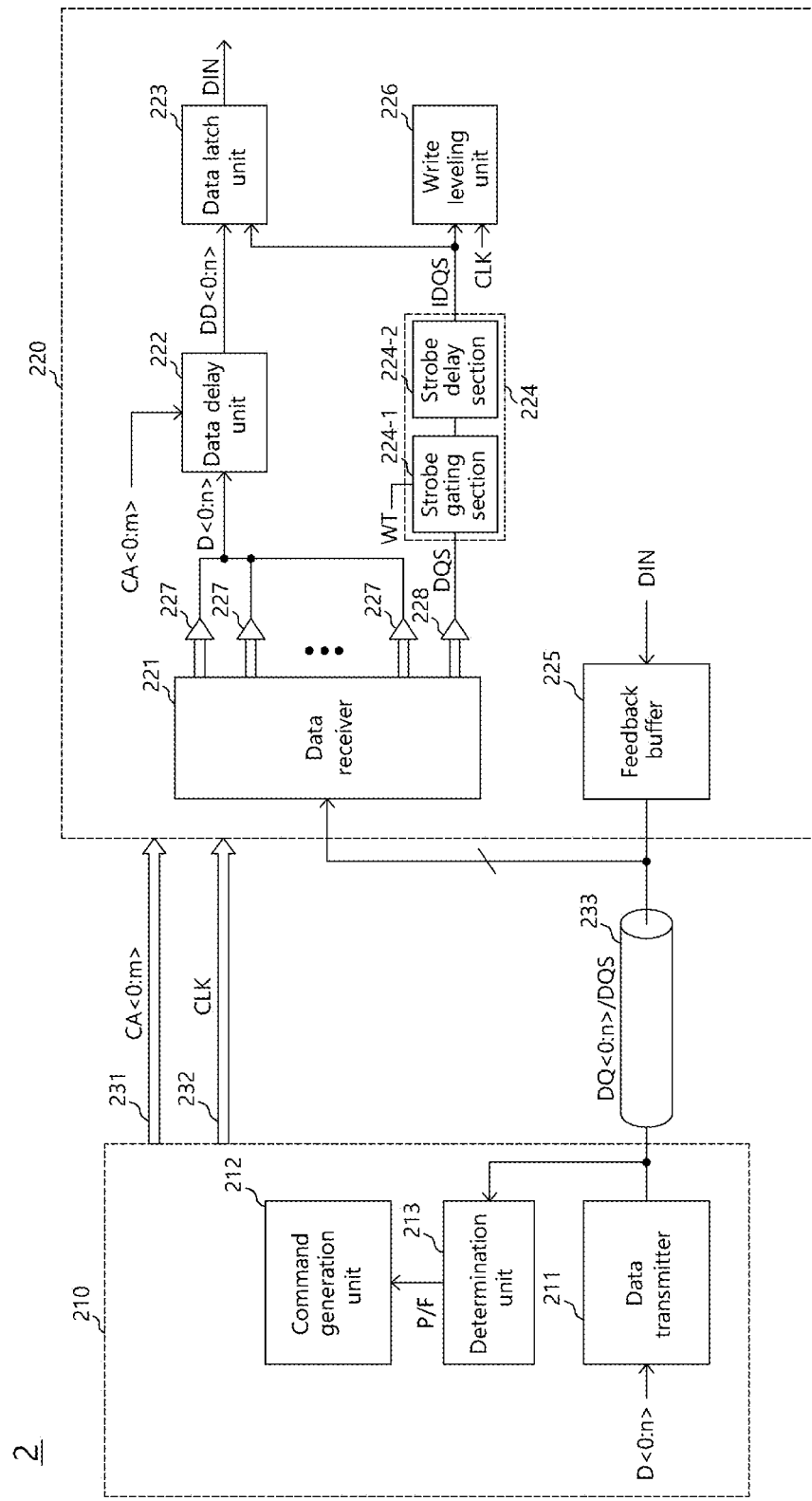
FIG. 2 is a diagram illustrating an example of a memory system in accordance with an embodiment.

FIG. 2 is a diagram illustrating an example of a memory system 2 in accordance with an embodiment. In FIG. 2, the memory system 2 may include a memory controller 210 and a memory apparatus 220. The memory controller 210 may transmit command and address signals CA<0:m> to the memory apparatus 220 through a first bus 231. The memory controller 210 may transmit a clock CLK to the memory apparatus 220 through a second bus 232. The memory controller 210 and the memory apparatus 220 may exchange data DQ<0:n> through a third bus 233. Signals transmitted through the third bus 233 may be a plurality of symbols in which the information on the data DQ<0:n> and a data strobe signal DQS is included. In an embodiment, the command and address signals CA<0:m> may also be converted into a plurality of symbols and be transmitted through the first bus 231.

The memory apparatus 220 may include a data receiver 221, a data delay unit 222, and a data latch unit 223. The data receiver 221 may be coupled to the third bus 233 and receive the plurality of symbols transmitted from the memory controller 210 through the third bus 233. The data receiver 221 may generate a plurality of data D<0:n> and a data strobe signal DQS based on the plurality of symbols. In an embodiment, the data receiver 221 may generate the plurality of data D<0:n> and the data strobe signal DQS by decoding the plurality of symbols. The plurality of data D<0:n> may be provided to the data delay unit 222 through a plurality of buffers 227.

The data delay unit 222 may variably delay the plurality of data D<0: n>, which is generated by the data receiver 221, based on the command and address signals CA<0:m> transmitted through the first bus 231 from the memory controller 210. The data delay unit 222 may variably delay the plurality of data D<0:n> and generate a plurality of delayed data DD<0:n>. A delay time of the data delay unit 222 may be increased or decreased according to the command and address signals CA<0:m>. The data delay unit 222 may control a timing between the data strobe signal DQS and the plurality of data D<0:n> by variably delaying the plurality of data D<0:n> by an appropriate delay time.

The data latch unit 223 may receive the plurality of delayed data DD<0:n>. The data latch unit 223 may generate internal data DIN from the plurality of delayed data DD<0:n> based on the data strobe signal DQS. In an embodiment, the data latch unit 223 may output, as the internal data DIN, the plurality of data D<0:n> realigned by the data strobe signal DQS, and the internal data DIN may be provided to an internal circuit of the memory apparatus 220.

The memory apparatus 220 may further include a strobe output unit 224. The strobe output unit 224 may delay the data strobe signal DQS, which is generated by the data receiver 221, by a predetermined delay time, and generate an internal strobe signal IDQS. The data strobe signal DQS may be provided to the strobe output unit 224 through a buffer 228. The data latch unit 223 may provide the plurality of delayed data DD<0:n> as the internal data DIN in synchronization with the internal strobe signal IDQS. The strobe output unit 224 may receive a write signal WT. The write signal WT is a signal that is internally generated when the memory apparatus 220 receives the command and address signals CA<0:m> indicating a write operation from the memory controller 210. The strobe output unit 224 may delay the data strobe signal DQS and generate the internal strobe signal IDQS when the write signal WT is enabled.

The strobe output unit 224 may include a strobe gating section 224-1 and a strobe delay section 224-2. The strobe gating section 224-1 may output the data strobe signal DQS in response to the write signal WT. The strobe gating section 224-1 may selectively output the data strobe signal DQS to the strobe delay section 224-2 depending on whether or not the write signal WT is enabled. For example, the strobe gating section 224-1 may output the data strobe signal DQS to the strobe delay section 224-2 when the write signal WT is enabled. The strobe delay section 224-2 may delay the data strobe signal DQS outputted from the strobe gating section 224-1 by a preset amount of time. Since the memory apparatus 220 receives the multi-level symbols in which the information of the data DQ<0:n> and the data strobe signal DQS is encoded and decodes the multi-level symbols, the data D<0:n> and the data strobe signal DQS, which are generated by decoding the multi-level symbols at the data receiver 221, may be generated at the same time. In other words, a point in time when the data D<0: n> transitions may correspond to the rising or falling edge of the data strobe signal DQS. However, in order to generate the internal data DIN at a predetermined time, a latch timing of the data latch unit 223 should be controlled a set-up and hold margin of data. To this end, the edge of the data strobe signal DQS may be positioned at the center of the valid window of the data D<0:n>. In order to control the phase of the edge of the data strobe signal DQS, the strobe delay section 224-2 may generate the internal strobe signal IDQS through delaying the data strobe signal DQS by the preset amount of time. When the memory controller 210 and the memory apparatus 220 perform a double-data-rate operation, the preset amount of time may be an amount of time corresponding to half a valid window of the data D<0:n> and/or corresponding to one fourth of a clock cycle of the clock CLK. The data strobe signal DQS may have the same or substantially the same cycle as the clock CLK.

The memory apparatus 220 may further include a feedback buffer 225. The feedback buffer 225 may provide the internal data DIN, which is generated by the data latch unit 223, to the memory controller 210 through the third bus 233. In an embodiment, the memory controller 210 may receive the internal data DIN through the third bus 233 and control the delay time of the data delay unit 222.

The memory apparatus 220 may further include a write leveling unit 226. The write leveling unit 226 may be provided to adjust the phase difference between the clock CLK and the internal strobe signal IDQS. The write leveling unit 226 may receive the internal strobe signal IDQS and the clock CLK, and output the internal strobe signal IDQS in synchronization with the clock CLK.

The memory controller 210 may include a data transmitter 211, a command generation unit 212, and a determination unit 213. The data transmitter 211 may generate the plurality of symbols based on the data D<0: n> which the memory controller 210 is trying to transmit to the memory apparatus 220. The command generation unit 212 may generate the command and address signals CA<0:m> for write and read operations based on a request received from a host device (not shown). Also, the memory controller 210 may generate the command and address signals CA<0:m> based on the internal data DIN fed back from the memory apparatus 220. The command and address signals CA<0:m> may be generated to adjust the delay time of the data delay unit 222.

The determination unit 213 may receive the internal data DIN through the third bus 233, determine whether the internal data DIN is identical to the data D<0:n> transmitted by the memory controller 210, and generate a determination signal P/F. For example, the determination unit 213 may disable the determination signal P/F if the internal data DIN is identical to the data D<0:n>, and enable the determination signal P/F if the internal data DIN is not identical to the data D<0:n>. The command generation unit 212 may generate the command and address signals CA<0:m> based on a determination result of the determination unit 213. The command generation unit 212 may generate the command and address signals CA<0:m> when the determination signal P/F is enabled, such that the delay time of the data delay unit 222 may be increased or decreased.

Figure 3:
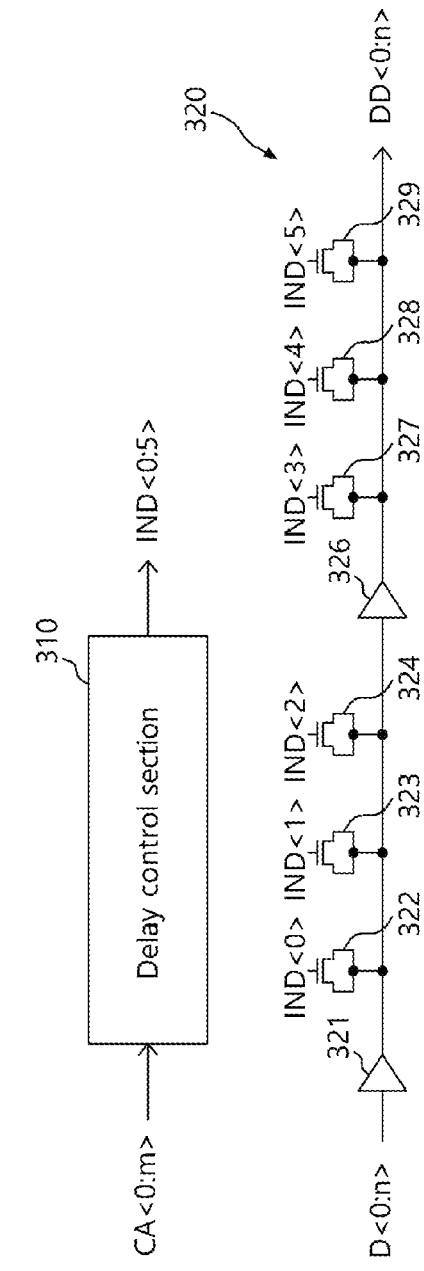
FIG. 3 is a diagram illustrating an example of a data delay unit shown in FIG. 2.

FIG. 3 is a diagram illustrating an example of the data delay unit 222 shown in FIG. 2. In FIG. 3, the data delay unit 222 may include a delay control section 310 and a variable delay section 320. The delay control section 310 may generate delay control signals IND<0:5> in response to the command and address signals CA<0:m>. The delay control signals IND<0:5> may include a plurality of codes, and the delay control section 310 may sequentially increase or decrease the code values of the delay control signals IND<0:5> in response to the command and address signals CA<0:m>. The delay control section 310 may use a thermometer encoder (not shown) which is able to sequentially increase or decrease the code values of the delay control signals IND<0:5> in response to the command and address signals CA<0:m>.

The variable delay section 320 may adjust the delay time of the plurality of data D<0:n> in response to the delay control signals IND<0:5>, and generate the delayed data DD<0:n>. The variable delay section 320 may include a plurality of buffers 321 and 326, and a plurality of MOS capacitors 322, 323, 324, 327, 328, and 329. The buffer 321 may receive the data D<0:n> through an input terminal thereof, and an input terminal of the buffer 326 may be coupled to an output terminal of the buffer 321. The buffer 326 may output the delayed data DD<0:n> through an output terminal thereof. The plurality of MOS capacitors 322, 323, 324, 327, 328, and 329 may receive the delay control signals IND<0:5> respectively allocated thereto. The first MOS capacitor 322 may receive the first code IND<0> of the delay control signals IND<0:5>, and the second to sixth MOS capacitors 323, 324, 327, 328, and 329 may receive the second to sixth codes IND<1> to IND<5> of the delay control signals IND<0:5>, respectively. The first to third MOS capacitors 322, 323, and 324 may be coupled to the output terminal of the buffer 321, and the fourth to sixth MOS capacitors 327, 328, and 329 may be coupled to the output terminal of the buffer 326. The first to sixth MOS capacitors 322, 323, 324, 327, 328, and 329 may increase the load impedance of the output terminals of the buffers 321 and 326 when they are turned on, and thereby increase the delay time of the variable delay section 320. While FIG. 3 shows an example in which the variable delay section 320 includes six MOS capacitors, it is to be noted that the number of MOS capacitors and the number of the codes of delay control signals may vary.

Figure 4:
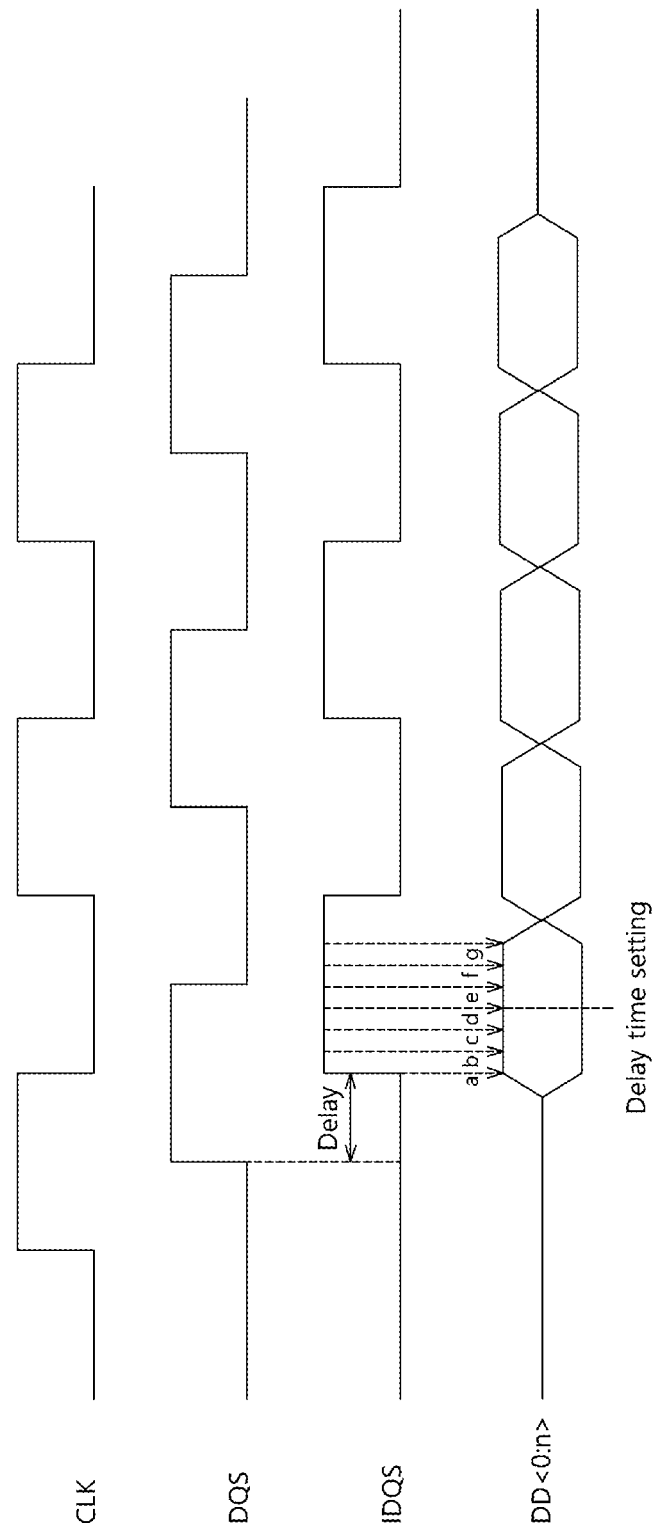
FIG. 4 is a timing diagram provided to assist in explaining operations of the memory system in accordance with an embodiment.

FIG. 4 is a timing diagram provided to assist in explaining the operation of the memory system 2 shown in FIG. 2. The operation of the memory system 2 in accordance with an embodiment will be described below with reference to FIGS. 2 to 4. The memory apparatus 220 may receive the plurality of symbols through the third bus 233 from the memory controller 210, and the data receiver 221 may generate the data D<0:n> and the data strobe signal DQS from the plurality of symbols. Since the data D<0:n> and the data strobe signal DQS are generated based on the plurality of symbols, the transition timing of the data D<0:n> may correspond to the rising or falling edge of the data strobe signal DQS. Therefore, the strobe output unit 224 may generate the internal strobe signal IDQS by delaying the data strobe signal DQS by the preset amount of time such that the edge of the data strobe signal DQS may be positioned at the center of the valid window of the data D<0:n>. However, it is difficult for the timing of the data D<0:n> and the internal strobe signal IDQS to be precisely aligned due to various factors that affect the signals.

The data latch unit 223 may provide the data D<0:n> as the internal data DIN in synchronization with the internal strobe signal IDQS. The internal data DIN may be fed back to the determination unit 213 of the memory controller 210 through the feedback buffer 225. The determination unit 213 may compare the data D<0:n>, which had been converted into the plurality of symbols to be transmitted to the memory apparatus 220, to the internal data DIN, and determine whether both the data correspond to each other. In the case where both the data do not correspond to each other, the determination unit 213 may enable the determination signal P/F.

The command generation unit 212 may generate the command and address signals CA<0:m> based on the determination signal P/F, and the delay control section 310 of the data delay unit 222 may sequentially increase the code values of the delay control signals IND<0:5> in response to the command and address signals CA<0:m>. For example, in each predetermined cycle, the delay control unit 310 may increase the number of codes that have logic high levels in response to the command and address signals CA<0:m>. Therefore, the MOS capacitors 322, 323, 324, 327, 328, and 329 which constitute the variable delay section 320 may be sequentially turned on, and the delay time of the variable delay section 320 may also be sequentially increased.

The command generation unit 212 may generate the command and address signals CA<0:m> until the determination signal P/F from the determination unit 213 is enabled again, such that the code values of delay control signals IND<0:5> may be increased. As shown in FIG. 4, it is assumed that the determination signal P/F is enabled when all the code values of the delay control signals IND<0:5> are logic low levels (see a). The command generation unit 212 may generate the command and address signals CA<0:m> such that the value of the first code IND<0> of the delay control signals IND<0:5> is changed to the logic high level (see b). As the data delay unit 222 delays the data D<0:n>, the determination signal P/F may be disabled. The command generation unit 212 may generate the command and address signals CA<0:m> such that the second to sixth codes IND<1:5> of the delay control signals IND<0:5> sequentially have the logic high level (see c to g). For example, if the determination signal P/F is enabled again when all the first to sixth codes IND<0:5> have the logic high level, the command generation unit 212 may calculate a median delay time d based on the timing margin of the delayed data DD<0:n> and the internal strobe signal IDQS. Accordingly, the command generation unit 212 may generate the command and address signals CA<0:m> such that the first to third codes IND<0:2> of the delay control signals IND<0:5> finally have the logic high level, and the data delay unit 222 may delay the data D<0:n> by the median delay time d and thereby generate the delayed data DD<0:n>. As a consequence, the data latch unit 223 of the memory apparatus 220 may capture the delayed data DD<0:n> of which timing is aligned by using the internal strobe signal IDQS, and may precisely generate the internal data DIN. While it was described as an example that the data delay unit 222 sequentially increases the code values of the delay control signals IND<0:5>, it is to be noted that the data delay unit 222 may set the delay time of data by sequentially decreasing the code values of the delay control signals IND<0:5>.

While various embodiments have been described above, it will be understood to those skilled in the art that the embodiments described are examples only. Accordingly, the memory apparatus with the training function and the memory system using the same described herein should not be limited based on the described embodiments.

What is claimed is:

1. A memory apparatus comprising:
a data receiver configured to receive a plurality of symbols and generate a plurality of data and a data strobe signal;
a data delay unit configured to, in response to a command and address signals, variably delay the plurality of data and generate a plurality of delayed data;
a strobe output unit configured to generate an internal strobe signal by delaying the data strobe signal by a predetermined delay time; and
a data latch unit configured to generate internal data from the plurality of delayed data in synchronization with the internal strobe signal.

2. The memory apparatus according to claim 1, wherein the data receiver decodes the plurality of symbols and generates the plurality of data and the data strobe signal.

3. The memory apparatus according to claim 1, wherein the data delay unit comprises:
a delay control section configured to generate delay control signals in response to the command and address signals; and
a variable delay section configured to, in response to the delay control signals, adjust a delay time of the plurality of data and generate the plurality of delayed data.

4. The memory apparatus according to claim 1, wherein the strobe output unit comprises:
a strobe gating section configured to output the data strobe signal in response to a write signal; and
a strobe delay section configured to delay the data strobe signal by a preset amount of time and output the delayed data strobe signal.

5. The memory apparatus according to claim 4, wherein the preset amount of time is an amount of time that corresponds to half a valid window of the plurality of data.

6. The memory apparatus according to claim 4, wherein the preset time is a time that corresponds to one fourth of a clock cycle.

7. The memory apparatus according to claim 1, wherein the memory apparatus receives the command and address signals in synchronization with the clock.

8. The memory apparatus according to claim 7, further comprising a write leveling unit configured to control timing of the clock and the internal strobe signal.

9. A memory system comprising:
a memory controller; and
a memory apparatus configured to communicate with the memory controller, the memory apparatus comprising:
a data receiver configured to receive a plurality of symbols from the memory controller and generate a plurality of data and a data strobe signal;
a data delay unit configured to receive a command and address signals from the memory controller, variably delay the plurality of data, and generate a plurality of delayed data; and
a data latch unit configured to generate internal data from the plurality of delayed data based on the data strobe signal,
wherein the memory controller receives the internal data from the memory apparatus and generates the command signal.

10. The memory system according to claim 9, wherein the data receiver decodes the plurality of symbols and generates the plurality of data and the data strobe signal.

11. The memory system according to claim 9, wherein the data delay unit comprises:
a delay control section configured to generate delay control signals based on the command signal; and
a variable delay section configured to, in response to the delay control signals, change a delay time of the plurality of data and generate the plurality of delayed data.

12. The memory system according to claim 9, wherein:
the memory apparatus further comprises a strobe output unit configured to generate an internal strobe signal by delaying the data strobe signal by a preset amount of time; and
the data latch unit provides the plurality of delayed data as the internal data in synchronization with the internal strobe signal.

13. The memory system according to claim 12, wherein the strobe output unit comprises:
a strobe gating section configured to output the data strobe signal in response to a write signal; and
a strobe delay section configured to delay the data strobe signal by the preset amount of time and output the delayed data strobe signal.

14. The memory system according to claim 9, wherein the memory apparatus further receives the command and address signals and a clock through a command address bus and a clock bus from the memory controller.

15. The memory system according to claim 9, wherein:
the data receiver receives the plurality of symbols through a data bus from the memory controller; and
the memory apparatus further comprises a feedback buffer configured to transmit the internal data to the memory controller through the data bus.

16. The memory system according to claim 9, wherein the memory controller comprises a data transmitter configured to encode a plurality of data, and transmit the plurality of symbols to the memory apparatus.

17. The memory system according to claim 9, wherein the memory controller further comprises:
   a determination unit configured to determine whether transmitted data and the internal data correspond to each other, based on the internal data; and
   a command generation unit configured to generate the command and address signals based on a determination result of the determination unit.

18. The memory system according to claim 17, wherein the command generation unit generates the command signal based on the determination result of the determination unit such that a delay time of the data delay unit is sequentially increased or decreased.

19. A memory apparatus comprising:
   a data receiver configured to receive a plurality of symbols from a memory controller and generate a plurality of data and a data strobe signal by decoding the plurality of symbols;
   a data delay unit including a delay control section configured to generate a plurality of delay control signals in response to command and address signals provided from the memory controller, and a variable delay section configured to delay the plurality of data, a delay time of the plurality of data being adjusted in response to the delay control signals, the variable delay section having a plurality of capacitors, each capacitor coupled to one of signal lines providing the plurality of delay control signals; and
   a data latch unit configured to generate internal data from the plurality of delayed data based on the timing of the data strobe signal.

20. The memory apparatus according to claim 19, further comprising a strobe output unit configured to generate an internal strobe signal by delaying the data strobe signal by a predetermined delay time, the data latch unit generating the internal data by outputting the plurality of delayed data in synchronization with the internal strobe signal.

* * * * *